United States Patent
Worley et al.

(10) Patent No.: US 9,614,542 B2
(45) Date of Patent: Apr. 4, 2017

(54) DAC WITH SUB-DACS AND RELATED METHODS

(71) Applicant: STMICROELECTRONICS, INC., Coppell, TX (US)

(72) Inventors: James L. Worley, Flower Mound, TX (US); Milad Alwardi, Allen, TX (US)

(73) Assignee: STMICROELECTRONICS, INC., Coppell, TX (US)

( * ) Notice: Subject to any disclaimer, the term of this patent is extended or adjusted under 35 U.S.C. 154(b) by 0 days.

(21) Appl. No.: 14/573,083

(22) Filed: Dec. 17, 2014

(65) Prior Publication Data

US 2016/0182079 A1 Jun. 23, 2016

(51) Int. Cl.
H03M 1/78 (2006.01)
H03M 1/68 (2006.01)

(52) U.S. Cl.
CPC ........................................ *H03M 1/68* (2013.01)

(58) Field of Classification Search
CPC ........ H03M 1/765; H03M 1/785; H03M 1/76; H03M 1/808; H03M 1/66; H03M 1/78
USPC .......................................... 341/144, 145, 154
See application file for complete search history.

(56) References Cited

U.S. PATENT DOCUMENTS

| | | | |
|---|---|---|---|
| 5,689,257 A | 11/1997 | Mercer et al. | |
| 5,714,953 A * | 2/1998 | Mitani | H03M 1/687 341/144 |
| 5,999,115 A | 12/1999 | Connell et al. | |
| 6,154,162 A | 11/2000 | Watson et al. | |
| RE37,619 E | 4/2002 | Mercer et al. | |
| 6,567,026 B1 * | 5/2003 | Gorman | H03M 1/682 341/136 |
| 6,970,121 B1 * | 11/2005 | Sun | G09G 3/3688 341/144 |
| 7,102,557 B1 | 9/2006 | Frith | |
| 7,136,002 B2 | 11/2006 | Dempsey et al. | |
| 7,425,941 B2 * | 9/2008 | Sung | G09G 3/3688 341/144 |
| 7,511,650 B2 * | 3/2009 | Chang | H03M 1/68 341/144 |
| 8,174,475 B2 * | 5/2012 | Nishimura | G09G 3/3696 341/144 |
| 8,581,766 B1 | 11/2013 | Li et al. | |
| 2001/0038351 A1 * | 11/2001 | Brunolli | H03M 1/682 341/154 |
| 2011/0006939 A1 * | 1/2011 | Hirai | H03M 1/682 341/145 |
| 2011/0148945 A1 * | 6/2011 | Matsuda | H03M 1/76 345/690 |
| 2013/0314263 A1 | 11/2013 | Dix | |
| 2014/0002289 A1 * | 1/2014 | Dempsey | H03M 1/66 341/145 |

* cited by examiner

*Primary Examiner* — Linh Nguyen (74) *Attorney, Agent, or Firm* — Slater Matsil, LLP (57) ABSTRACT

A DAC may include a decoder configured to receive a digital input signal, and first and second sub-DACs coupled in parallel to the decoder, each of the first and second sub-DACs having first and second LSB banks, and an MSB bank coupled between the first and second LSB banks. The decoder may be configured to selectively control the first and second LSB banks, and the MSB bank based upon the digital input signal. The DAC may include an output network coupled to the first and second sub-DACs and configured to generate an analog output signal related to the digital input signal.

22 Claims, 6 Drawing Sheets

| MSB B<7> | LSB<1> | LSB<0> | OUTPUT |
| --- | --- | --- | --- |
| 0 | 0 | 0 | 0000 |
| 0 | 0 | 1 | 0010 |
| 0 | 1 | 0 | 0100 |
| 0 | 1 | 1 | 1000 |
| 1 | 0 | 0 | 1000 |
| 1 | 0 | 1 | 0100 |
| 1 | 1 | 0 | 0010 |
| 1 | 1 | 1 | 0001 |

FIG. 5A

| MSB B<7> | MSB B<5:2> | OUTPUT |
|---|---|---|
| 0 | 0000 | 0000,0000,0000,0001 |
| 0 | 0001 | 0000,0000,0000,0010 |
| 0 | 0010 | 0000,0000,0000,0100 |
| 0 | 0011 | 0000,0000,0000,1000 |
| 0 | 0100 | 0000,0000,0001,0000 |
| 0 | 0101 | 0000,0000,0010,0000 |
| 0 | 0110 | 0000,0000,0100,0000 |
| 0 | 0111 | 0000,0000,1000,0000 |
| 0 | 1000 | 0000,0001,0000,0000 |
| 0 | 1001 | 0000,0010,0000,0000 |
| 0 | 1010 | 0000,0100,0000,0000 |
| 0 | 1011 | 0000,1000,0000,0000 |
| 0 | 1100 | 0001,0000,0000,0000 |
| 0 | 1101 | 0010,0000,0000,0000 |
| 0 | 1110 | 0100,0000,0000,0000 |
| 0 | 1111 | 1000,0000,0000,0000 |
| 1 | 0000 | 1000,0000,0000,0000 |
| 1 | 0001 | 0100,0000,0000,0000 |
| 1 | 0010 | 0010,0000,0000,0000 |
| 1 | 0011 | 0001,0000,0000,0000 |
| 1 | 0100 | 0000,1000,0000,0000 |
| 1 | 0101 | 0000,0100,0000,0000 |
| 1 | 0110 | 0000,0010,0000,0000 |
| 1 | 0111 | 0000,0001,0000,0000 |
| 1 | 1000 | 0000,0000,1000,0000 |
| 1 | 1001 | 0000,0000,0100,0000 |
| 1 | 1010 | 0000,0000,0010,0000 |
| 1 | 1011 | 0000,0000,0001,0000 |
| 1 | 1100 | 0000,0000,0000,1000 |
| 1 | 1101 | 0000,0000,0000,0100 |
| 1 | 1110 | 0000,0000,0000,0010 |
| 1 | 1111 | 0000,0000,0000,0001 |

*FIG. 5B*

DAC WITH SUB-DACS AND RELATED METHODS

TECHNICAL FIELD

The present disclosure relates to the field of electronic devices, and, more particularly, to digital-to-analog converters and related methods.

BACKGROUND

Digital-to-analog conversion for audio applications is performed by generating an output analog signal as the sum, at each sampling instant, of a given number of elementary quantities or contributions. The elementary quantities may comprise, for example, currents supplied by elementary current generators or generated by resistors, or charge stored in capacitors. Digital-to-analog conversion can be roughly divided in two major categories according to the approach adopted in the conversion, i.e. namely either "thermometric" or "binary" coding.

In thermometric coding, the elementary contributions used for generating the output analog signal assume values identical to one another and are generated by distinct sources numbering N, where $N=2^n$ represents the number of levels of the output analog signal for a number of bits equal to n. Optionally, in order to obtain a balanced output analog signal, i.e. an output signal of zero mean value, able to assume either positive values or negative values that are symmetrical with respect to zero, half (N/2) of the elementary sources may be designed for supplying positive elementary contributions and the other half of the sources for supplying negative elementary contributions to the output analog signal. The value of each elementary contribution is $2A_{MAX}/2^n$, where $A_{MAX}$ represents the maximum amplitude, either positive or negative, that the output analog signal should assume.

Differently, in binary coding, the number of distinct sources to be implemented for providing the elementary contributions is equal to the number of bits n of the digital-to-analog converter that is equal to $n=\log_2 N$. The dimensions of the integrated elementary sources (e.g. current generators) are not identical but appropriately graded in such a way that the elementary contributions thereby produced are submultiples of a power of 2 with respect to the maximum value $A_{MAX}$, in which the least significant bit (LSB) has a weight of $2A_{MAX}/2^n$, while the most significant bit (MSB) has a weight of $A_{MAX}$.

SUMMARY

Generally speaking, a digital-to-analog converter (DAC) may include a decoder configured to receive a digital input signal, and first and second sub-DACs coupled in parallel to the decoder. Each of the first and second sub-DACs may comprise first and second LSB banks, and an MSB bank coupled between the first and second LSB banks. The decoder may be configured to selectively control the first and second LSB banks, and the MSB bank based upon the digital input signal. The DAC may include an output network coupled to the first and second sub-DACs and configured to generate an analog output signal related to the digital input signal.

More specifically, the decoder may be configured to set states of the first and second LSB banks based upon LSB values from the digital input signal. The decoder may be configured to set the states of the first and second LSB banks so that the state of the first LSB bank is complementary with the state of the second LSB bank. The decoder may be configured to set a state of the MSB bank based upon MSB values from the digital input signal. The output network may comprise first and second pluralities of switches coupled respectively to outputs of the first and second sub-DACs.

Additionally, each LSB bank may comprise a plurality of LSB switches coupled in parallel to one of first and second reference voltages, and a plurality of LSB resistors, each LSB resistor being coupled between adjacent ones of the plurality of LSE switches. The MSB bank may comprise a plurality of MSB switches coupled in parallel to an output of each sub-DAC, and a plurality of MSB resistors, each MSB resistor being coupled between adjacent ones of the plurality of MSB switches. The plurality of MSB switches and the plurality of MSB resistors may define an adjustable voltage divider. Each MSB resistor may have a resistance value four times a resistance value of each LSB resistor.

Another aspect is directed to a first sub-DAC in a DAC, the DAC comprising a second sub-DAC coupled in parallel to the first sub-DAC, a decoder receiving a digital input signal and being coupled to the first and second sub-DACs, and an output network coupled to the first and second sub-DACs and generating an analog output signal related to the digital input signal. The first sub-DAC may include first and second LSB banks, and an MSB bank coupled between the first and second LSB banks, the decoder selectively controlling the first and second LSB banks, and the MSB bank based upon the digital input signal.

Another aspect is directed to a method of making a DAC. The method may include providing a decoder to receive a digital input signal, and coupling first and second sub-DACs in parallel to the decoder. Each of the first and second sub-DACs may include first and second LSB banks, and an MSB bank coupled between the first and second LSB banks. The decoder may selectively control the first and second LSB banks, and the MSB bank based upon the digital input signal. The method may include coupling an output network to the first and second sub-DACs and to generate an analog output signal related to the digital input signal.

DETAILED DESCRIPTION

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and prime notation is used to indicate similar elements in alternative embodiments.

Figure 1:
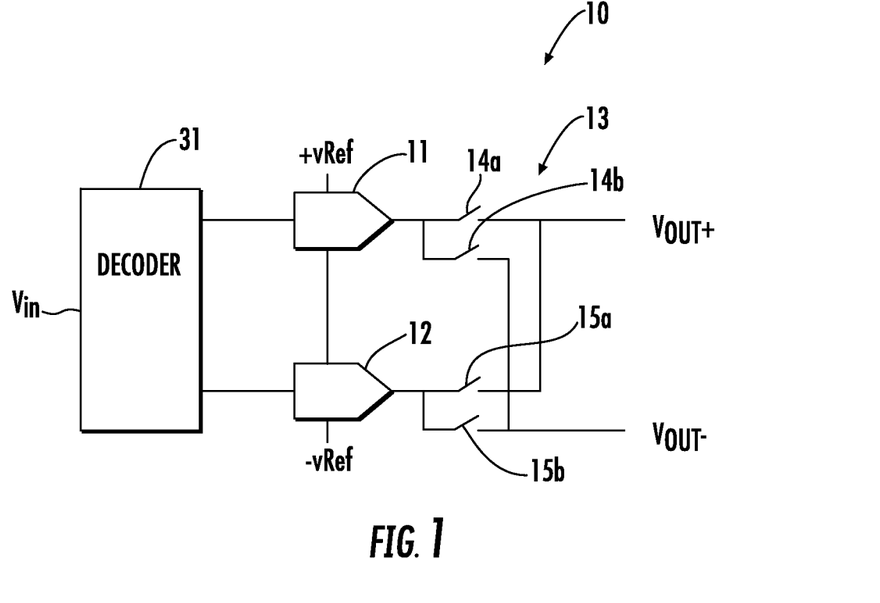
FIG. 1 is a schematic diagram of a DAC, according to the present disclosure.
Figure 2:
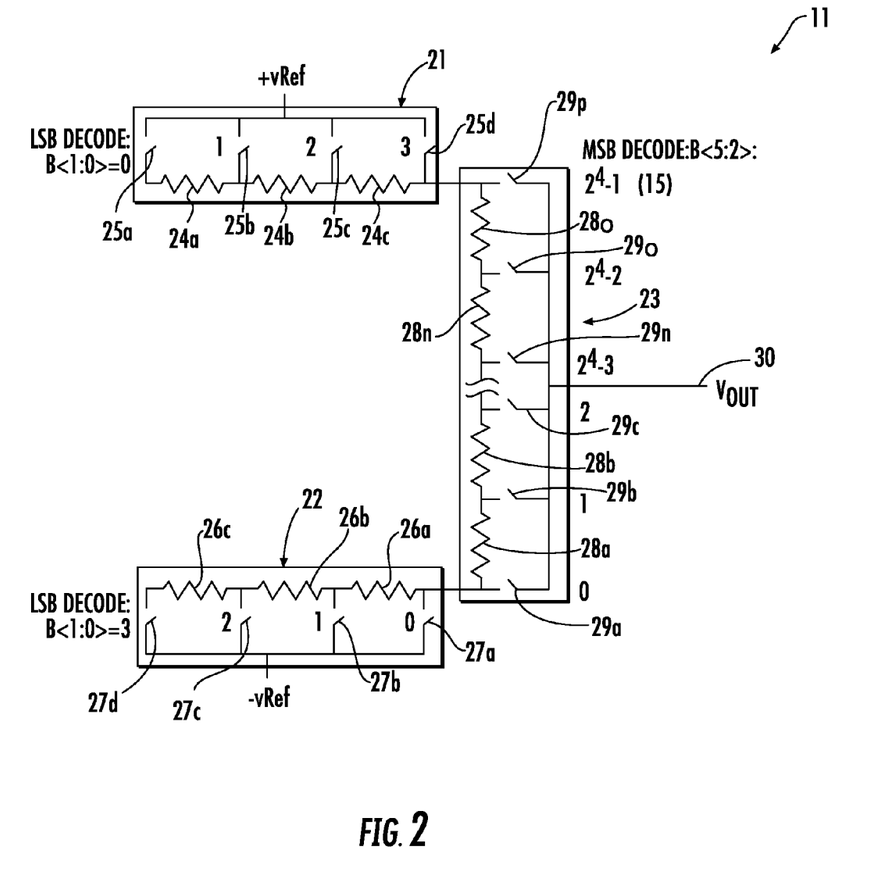
FIG. 2 is a more detailed schematic diagram of a sub-DAC from the DAC of FIG. 1.

Referring initially to FIGS. 1-2, a DAC 10 according to the present disclosure is now described. The DAC 10 illustratively includes a decoder 31 configured to receive a digital input signal $V_{in}$. The DAC 10 illustratively includes first and second sub-DACs 11, 12 coupled in parallel to the decoder 31. Although only the first sub-DAC 11 is shown in detail (See FIG. 2), the second sub-DAC 12 has an identical structure.

In the illustrated embodiment, the DAC is a 6-bit DAC (i.e. the digital input signal $V_{in}$ has a 6-bit digital value), which is shown for exemplary purposes only. The teachings herein can be modified to convert other sizes of digital input signals. In the illustrated embodiment, the digital input signal $V_{in}$ has 4 MSBs and 2 LSBs.

Each of the first and second sub-DACs 11, 12 illustratively includes first and second LSB banks 21, 22, and an MSB bank 23 coupled between the first and second LSB banks. The decoder 31 is configured to selectively control the first and second LSB banks 21, 22, and the MSB bank 23 based upon the digital input signal $V_{in}$.

More specifically, the decoder 31 is configured to set states of the first and second LSB banks 21, 22 based upon LSB values from the digital input signal $V_{in}$. The decoder 31 is configured to set the states of the first and second LSB banks 21, 22 so that the state of the first LSB bank is complementary with the state of the second LSB bank. Also, the decoder 31 is configured to set a state of the MSB bank 23 based upon MSB values from the digital input signal $V_{in}$.

Additionally, each LSB bank 21, 22 illustratively includes a plurality of LSB switches 25a-25d, 27a-27d coupled in parallel to one of first and second reference voltages +Vref, −Vref, and a plurality of LSB resistors 24a-24c, 26a-26c, each LSB resistor being coupled between adjacent ones of the plurality of LSB switches. As perhaps best shown in FIG. 2, the first and second LSB banks 21, 22 are arranged in complementary fashion. The first and second LSB banks 21, 22 may define upper and lower rheostats, respectively (the LSBs selecting the resistance value between +Vref, −Vref and an output 30).

The upper and lower rheostats are controlled by the LSB decode (via decoder 31) in complementary fashion, i.e. when LSB bit 0 is active (input code=0), all of the resistors in the upper chain are included in the circuit (via LSB switch 25a), but none of the resistors in the lower chain are included (all shorted by the 0 state LSB switch 27a). As the input code increases, more resistors are included in the lower rheostat chain, and less in the upper chain. Selecting the various LSB combinations shifts the reference voltages available to the MSB portion of the circuit. Also, the total impedance of the chain, resistance from +Vref to −Vref, is constant for all input codes.

In particular, since the illustrated embodiment has 2 LSBs, there are four possible states (0-3) for these bits. Each LSB switch 25a-25d, 27a-27d is associated with one of the four states, but in complementary fashion. The LSB switches 25a-25d, 27a-27d associated with the state are closed, and the other LSB switches are opened. For example, when the LSBs have zero values, i.e. 00, the LSB switches 25a, 27a associated with the 0 state are closed; and when the LSBs have one values, i.e. 11, the LSB switches 25d, 27d associated with the 3 state are closed.

The MSB bank 23 illustratively includes a plurality of MSB switches 29a-29p coupled in parallel to an output 30 of each sub-DAC 11, 12, and a plurality of MSB resistors 28a-28o, each MSB resistor being coupled between adjacent ones of the plurality of MSB switches. Each MSB resistor 28a-28o may have a resistance value four times a resistance value of each LSB resistor 24a-24c, 26a-26c.

The plurality of MSB switches 29a-29p and the plurality of MSB resistors 28a-28o may define an adjustable voltage divider, i.e. a potentiometer (the four MSBs select the voltage tap to be used). The total chain impedance remains constant, but a different voltage tap is chosen for each permutation of MSB input code. As the "count" increases, a greater voltage is generated by selecting the proper switch, and only one MSB switch 29a-29p is active (i.e. closed) at a time.

The ratios of resistances are chosen based on the number of LSBs per MSB. For the illustrated example, two input bits are chosen to control the four LSB related switches 25a-25d, 27a-27d. So, the resistance of each LSB specific resistor 24a-24c, 26a-26d is ¼ of the resistance of an MSB resistance. Only three resistors ($2^2$−1) are required, to give the four voltage variations (e.g. use zero, one, two or three for four permutations). If three LSBs were chosen for the architecture, the LSB specific resistors 24a-24c, 26a-26d would be ⅛ of the resistance of the MSB resistors 28a-28o, and there would be 7 ($2^3$−1) included in the chain. Likewise with the MSB resistor chain, only 15 resistors 28a-28o are required to create 16 voltage taps, and a 4-bit code is used to select which one of sixteen is active.

Each of the sub-DACs 11, 12 is a two-stage (sliding window) architecture. Advantageously, the two-stage approach uses combinations of resistors in parallel and series to minimize the number of switches and resistors required to construct the DAC 10, thereby making the device desirably smaller. The exemplary embodiment shown in FIG. 2 is for a 6-bit sub-DAC, which would be used to construct a 7-bit differential DAC. It illustrates the locations of the LSB versus MSB controlled portions of the sub-DAC 11, 12, and the resistance ratios utilized to achieve the proper linear operation.

Also, since the illustrated embodiment has 4 MSBs, there are sixteen possible states (0-15) for these bits. Each MSB switch 29a-29p is associated with one of the sixteen states. The MSB switch 29a-29p associated with the state are closed, and the other MSB switches are opened. For example, when the MSBs have zero values, i.e. 0000, the MSB switch 29a associated with the 0 state is closed; and when the MSBs have one values, i.e. 1111, the MSB switch 29p associated with the 15 state is closed. Hence, when the digital input signal $V_{in}$ has a value of 000000, the LSB switches 25a, 27a, and the MSB switch 29a are closed, producing an output value equal to −Vref (i.e. the floor of the DAC's 10 dynamic range); and when the digital input signal $V_{in}$ has a value of 111111, the LSB switches 25d, 27d, and the MSB switch 29p are closed, producing an output value equal to +Vref (i.e. the ceiling of the DAC's dynamic range).

The DAC illustratively includes an output network 13 coupled to the first and second sub-DACs 11, 12 and configured to generate an analog output signal $V_{out+}$, $V_{out-}$ (i.e. a differential analog output version of the digital input signal $V_{in}$) related to the digital input signal $V_{in}$. The output network 13 illustratively includes first and second pluralities of switches 14a-14b, 15a-15b coupled respectively to outputs of the first and second sub-DACs 11, 12. The output network 13 is configured to allow swapping of which DAC output $V_{out+}$, $V_{out-}$ is positive and negative.

Another aspect is directed to a first sub-DAC 11 in a DAC 10. The DAC 10 includes a second sub-DAC 12 coupled in parallel to the first sub-DAC 11, a decoder 31 receiving a digital input signal $V_{in}$ and being coupled to the first and second sub-DACs, and an output network 13 coupled to the first and second sub-DACs and generating an analog output signal $V_{out+}$, $V_{out-}$ related to the digital input signal. The first sub-DAC 11 may include first and second LSB banks 21, 22, and an MSB bank 23 coupled between the first and second LSB banks, the decoder selectively controlling the first and second LSB banks, and the MSB bank based upon the digital input signal $V_{in}$.

Another aspect is directed to a method of making a DAC 10. The method may include providing a decoder 31 to receive a digital input signal $V_{in}$, and coupling first and second sub-DACs 11, 12 in parallel to the decoder. Each of the first and second sub-DACs 11, 12 may include first and second LSB banks 21, 22, and an MSB bank 23 coupled between the first and second LSB banks. The decoder 31 may selectively control the first and second LSB banks, and the MSB bank based upon the digital input signal $V_{in}$. The method may include coupling an output network 13 to the first and second sub-DACs 11, 12 and to generate an analog output signal $V_{out+}$, $V_{out-}$ related to the digital input signal $V_{in}$.

Figure 3:
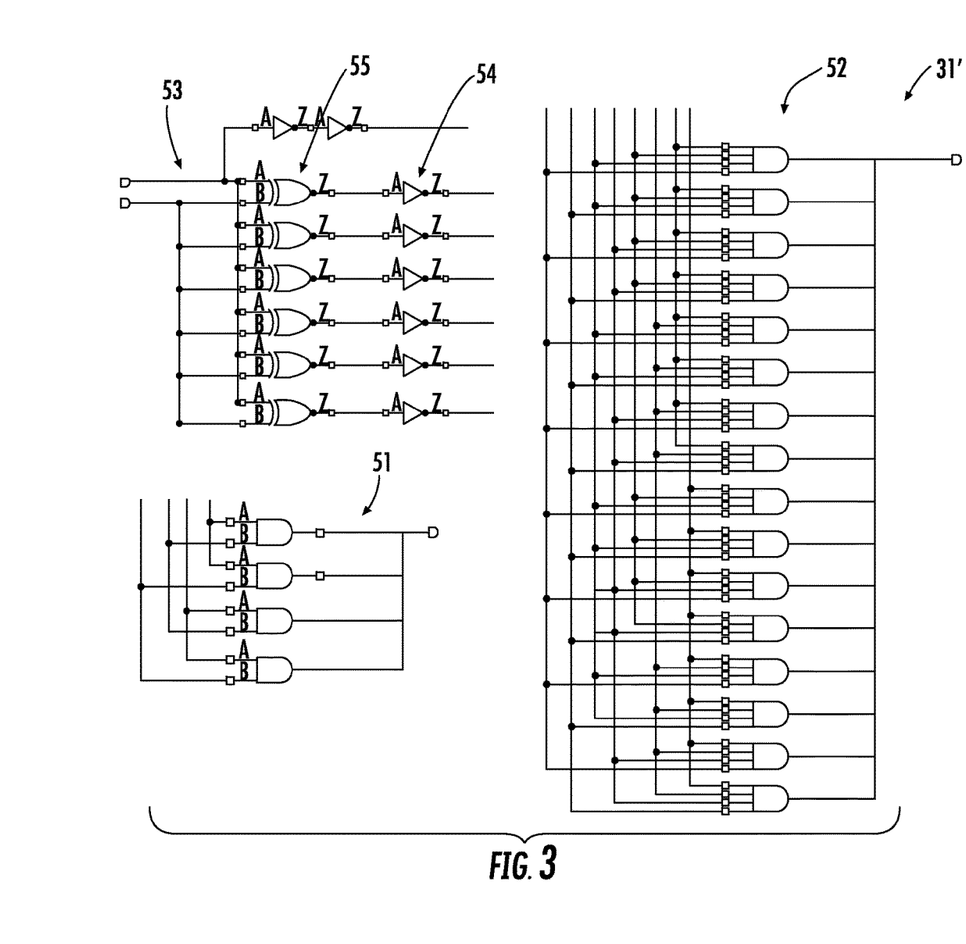
FIG. 3 is a schematic diagram of another embodiment of the decoder, according to the present disclosure.

Referring now additionally to FIG. 3, another embodiment of the decoder 31' is now described. In this embodiment of the decoder 31', those elements already discussed above with respect to FIGS. 1-2 are given prime notation and most require no further discussion herein. This embodiment differs from the previous embodiment in that this decoder 31' is a combination of two typical decoders, with a group of input buffers 53. The group of input buffers 53 is used to create true (BT) and complement (BN) phases for each of the 7 input bits B<6>, B<5>, B<4>, B<3>B<2>, B<1>, and B<0> (in buss nomenclature referred to as B<6:0>).

The decoder 51 in the lower left is a 2-bit to 4-bit decoder, and the decoder 52 on the right is a 4-bit to 16-bit decoder. The two LSBs (B<1:0>) are used to select which output of the 2-bit to 4-bit decoder is active, and the upper four bits (B<5:2>) are used to select which output of the four to sixteen decoders 51, 52 is active. The inverters 54 are used for buffering the input (i.e. to provide proper fan out) to the many gates involved in the decoder.

Figure 4:
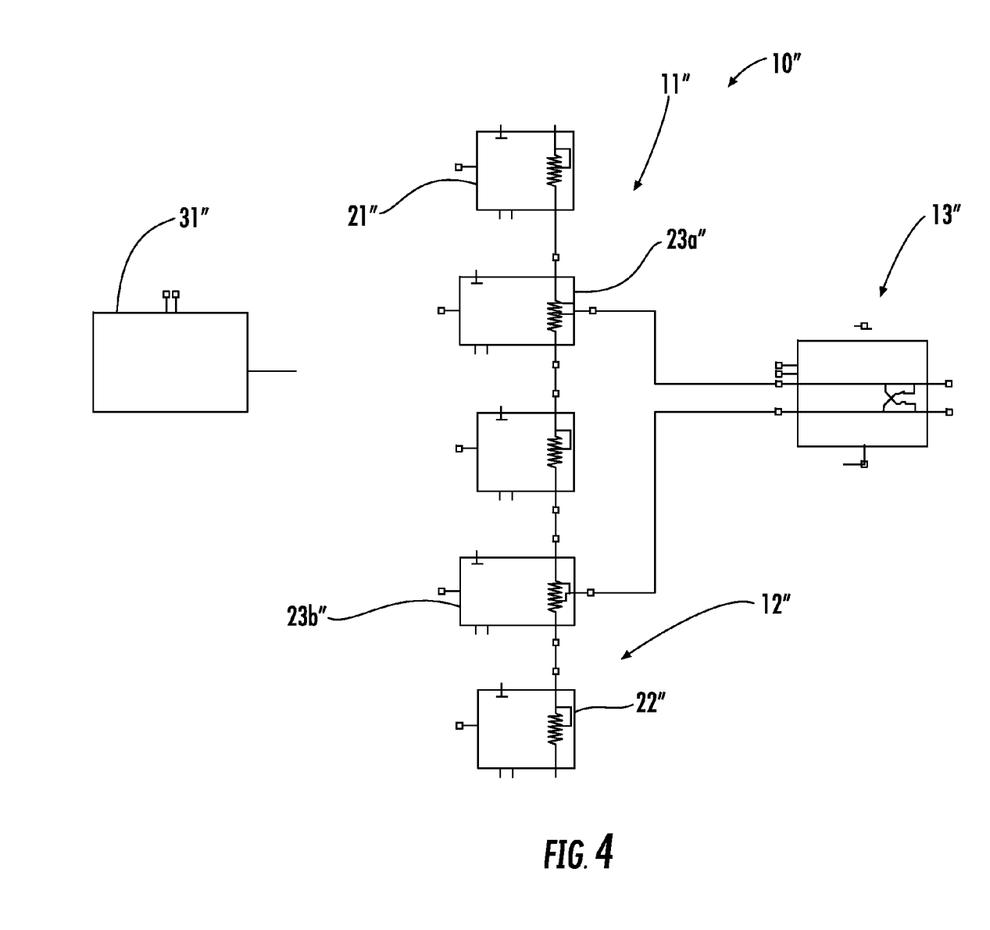
FIG. 4 is a schematic diagram of another embodiment of the DAC, according to the present disclosure.

For the full differential decoder, the single MSB is used to control the output switching circuit on the extreme right of FIG. 4, and also to invert the phases of all the input bits. The output switching is to essentially swap which sub-DAC 11, 12 provides +Vout or not. For MSB=0, the lower sub-DAC provides the −Vout, and the upper sub-DAC provides the +Vout. For MSB=1, the lower sub-DAC 12 provides the +Vout, and the upper sub-DAC 11 provides the −Vout. The inversion of the input data when the MSB is high is accomplished with exclusive NOR gates 55, which replace the inverters 54 used for the first stage of input buffering.

Referring now additionally to FIG. 4, another embodiment of the DAC 10" is now described. In this embodiment of the DAC 10", those elements already discussed above with respect to FIGS. 1-2 are given double prime notation and most require no further discussion herein. This embodiment differs from the previous embodiment in that this DAC 10" is a 10-bit differential DAC. The combination of the upper LSB portion of the lower sub-DAC and the lower LSB portion of the upper sub-DAC gives rise to the depicted architecture.

Figure 5A:
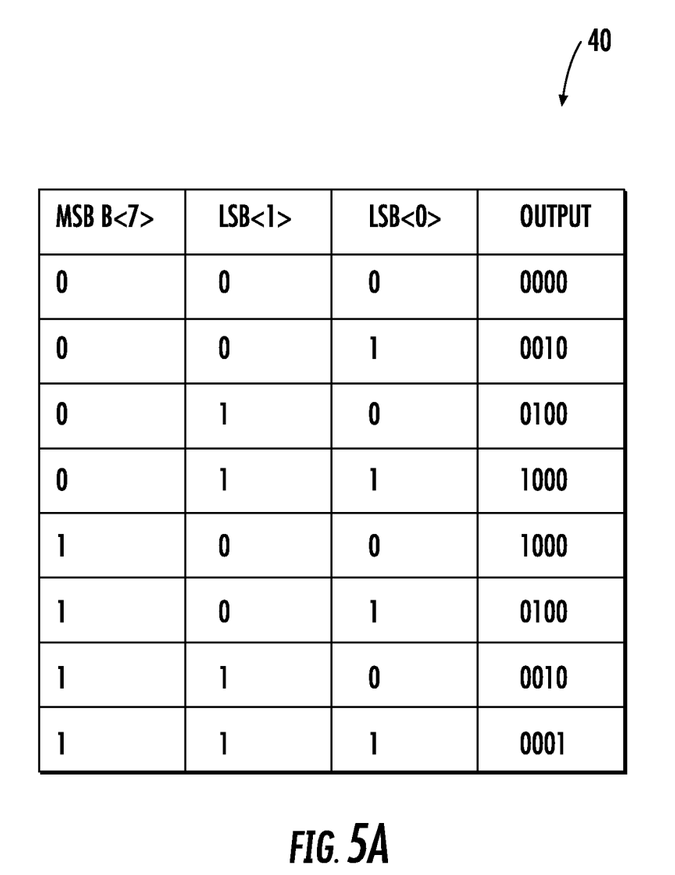
FIGS. 5A-5B are truth tables for an embodiment of the DAC, according to the present disclosure.
Figure 5B:
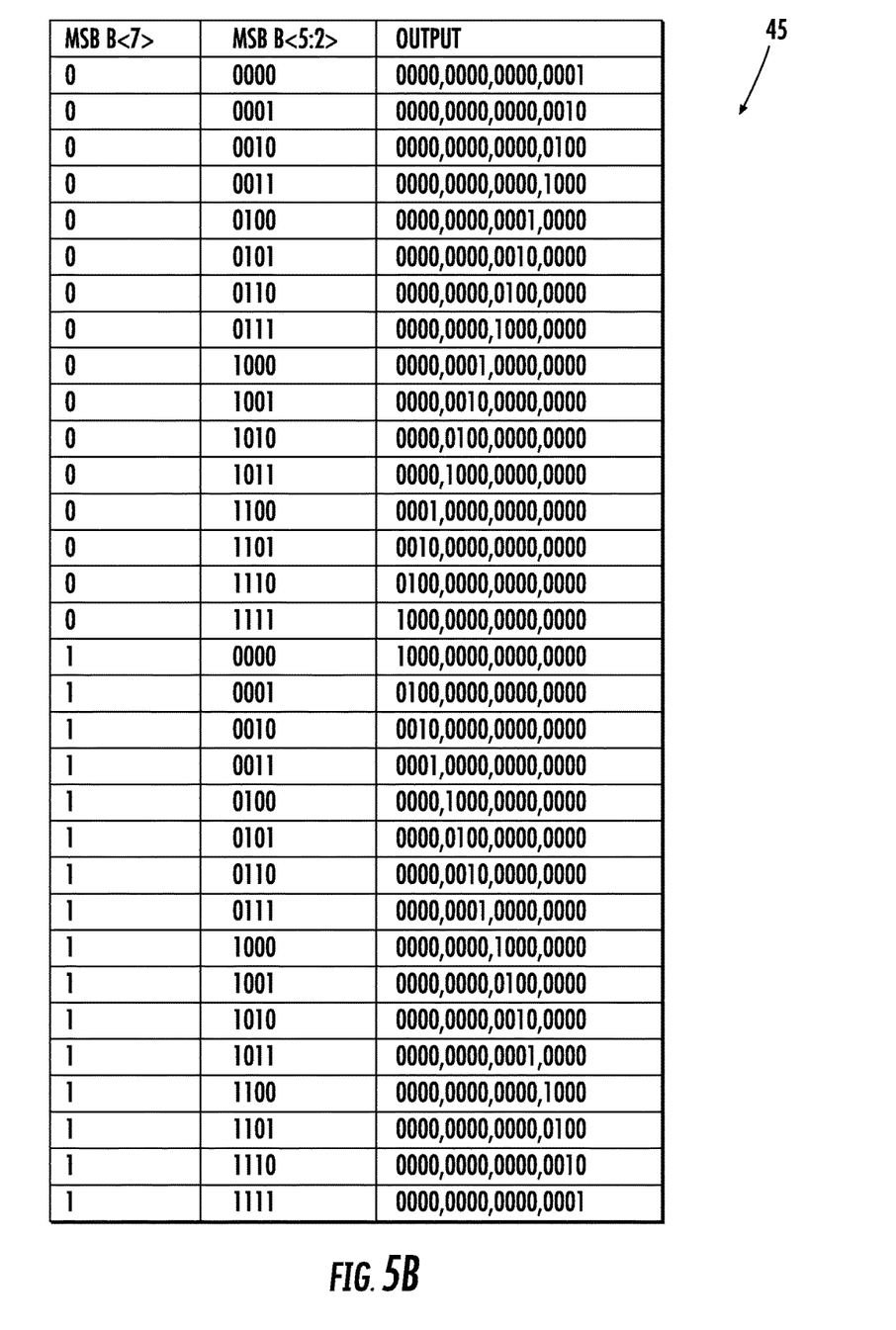

Referring now additionally to FIGS. 5A and 5B, truth tables 40, 45 are shown, associated with a 7-bit DAC, for example, such as shown in FIGS. 2 and 3. In the truth table 40, the normal binary behavior of the first four rows and a reflection of that behavior on the output in the following four rows for the LSB decoder. The reflection occurs around row #16 for the MSB decoder (truth table 45), where the MSB changes states. This behavior is required due to the monotonic output required after the swapping of the outputs. The output of the LSB decoder feeds all three of the LSB rheostats, and the output of the MSB decoder feeds both digital potentiometers.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:

1. A digital-to-analog converter (DAC) comprising:
   a decoder configured to receive a digital input signal;
   first and second sub-DACs coupled in parallel to said decoder, each of said first and second sub-DACs comprising first and second least significant bit (LSB) banks, and a most significant bit (MSB) bank coupled between said first and second LSB banks;
   said decoder configured to selectively control the first and second LSB banks, and the MSB bank based upon the digital input signal; and
   an output network coupled to said first and second sub-DACs and configured to generate an analog output signal related to the digital input signal;
   said first and second LSBs banks being respectively coupled to first and second reference voltages, the second reference voltage being less than the first reference voltage;
   said decoder comprising
      a first decoder circuit having a first bit length,
      a second decoder circuit having a second bit length greater than the first bit length, and
      logic circuitry configured to buffer the digital input signal for said first and second decoder circuits, each of the first and second decoder circuits having a plurality of outputs, LSB values from the digital input signal controlling enabling of the plurality of outputs of said first decoder circuit, MSB values from the digital input signal controlling enabling of the plurality of outputs of said second decoder circuit,
      said logic circuitry comprising a plurality of exclusive OR gates coupled in parallel, and a plurality of inverters coupled downstream from said plurality of exclusive OR gates.

2. The DAC of claim 1 wherein said decoder is configured to set states of the first and second LSB banks based upon the LSB values from the digital input signal.

3. The DAC of claim 2 wherein said decoder is configured to set the states of the first and second LSB banks so that the state of the first LSB bank is complementary with the state of the second LSB bank.

4. The DAC of claim 1 wherein said decoder is configured to set a state of the MSB bank based upon the MSB values from the digital input signal.

5. The DAC of claim 1 wherein said output network comprises first and second pluralities of switches coupled respectively to outputs of said first and second sub-DACs.

6. The DAC of claim 1 wherein each LSB bank comprises:
   a plurality of LSB switches coupled in parallel to one of the first and second reference voltages; and a plurality of LSB resistors, each LSB resistor being coupled between adjacent ones of said plurality of LSB switches.

7. The DAC of claim 6 wherein said MSB bank comprises:
a plurality of MSB switches coupled in parallel to an output of each sub-DAC; and
a plurality of MSB resistors, each MSB resistor being coupled between adjacent ones of said plurality of MSB switches.

8. The DAC of claim 7 wherein said plurality of MSB switches and said plurality of MSB resistors define an adjustable voltage divider.

9. The DAC of claim 7 wherein each MSB resistor has a resistance value four times a resistance value of each LSB resistor.

10. A first sub-digital-to-analog converter (DAC) in a DAC, the DAC comprising a second sub-DAC coupled in parallel to the first sub-DAC, a decoder receiving a digital input signal and being coupled to the first and second sub-DACs, and an output network coupled to the first and second sub-DACs and generating an analog output signal related to the digital input signal, the first sub-DAC comprising:
first and second least significant bit (LSE) banks; and
a most significant bit (MSB) bank coupled between said first and second LSE banks, the decoder selectively controlling the first and second LSB banks, and the MSB bank based upon the digital input signal;
said first and second LSBs banks respectively coupled to first and second reference voltages, the second reference voltage being less than the first reference voltage;
the decoder comprising
a first decoder circuit having a first bit length,
a second decoder circuit having a second bit length greater than the first bit length, and
logic circuitry configured to buffer the digital input signal for said first and second decoder circuits, each of the first and second decoder circuits having a plurality of outputs, LSB values from the digital input signal controlling enabling of the plurality of outputs of said first decoder circuit, MSE values from the digital input signal controlling enabling of the plurality of outputs of said second decoder circuit,
said logic circuitry comprising a plurality of exclusive OR gates coupled in parallel, and a plurality of inverters coupled downstream from said plurality of exclusive OR gates.

11. The first sub-DAC of claim 10 wherein states of the first and second LSB banks are set based upon the LSB values from the digital input signal.

12. The first sub-DAC of claim 11 wherein states of the first and second LSB banks are set so that the state of the first LSB bank is complementary with the state of the second LSB bank.

13. The first sub-DAC of claim 10 wherein a state of the MSB bank is set based upon the MSB values from the digital input signal.

14. The first sub-DAC of claim 10 wherein each LSB bank comprises:
a plurality of LSB switches coupled in parallel to one of the first and second reference voltages; and
a plurality of LSB resistors, each LSB resistor being coupled between adjacent ones of said plurality of LSB switches.

15. The first sub-DAC of claim 14 wherein said MSB bank comprises:
a plurality of MSB switches coupled in parallel to an output of each sub-DAC; and
a plurality of MSB resistors, each MSB resistor being coupled between adjacent ones of said plurality of MSB switches.

16. A method of making a digital-to-analog converter (DAC) comprising:
providing a decoder to receive a digital input signal;
coupling first and second sub-DACs in parallel to the decoder, each of the first and second sub-DACs comprising first and second least significant bit (LSB) banks, and a most significant bit (MSB) bank coupled between the first and second LSB banks, the decoder selectively controlling the first and second LSB banks, and the MSB bank based upon the digital input signal; and
coupling an output network to the first and second sub-DACs and to generate an analog output signal related to the digital input signal;
the first and second LSBs banks being respectively coupled to first and second reference voltages, the second reference voltage being less than the first reference voltage;
the decoder comprising
a first decoder circuit having a first bit length,
a second decoder circuit having a second bit length greater than the first bit length, and
logic circuitry configured to buffer the digital input signal for the first and second decoder circuits, each of the first and second decoder circuits having a plurality of outputs, LSB values from the digital input signal controlling enabling of the plurality of outputs of the first decoder circuit, MSB values from the digital input signal controlling enabling of the plurality of outputs of the second decoder circuit,
the logic circuitry comprising a plurality of exclusive OR gates coupled in parallel, and a plurality of inverters coupled downstream from the plurality of exclusive OR gates.

17. The method of claim 16 wherein the decoder sets states of the first and second LSB banks based upon the LSB values from the digital input signal.

18. The method of claim 17 wherein the decoder sets the states of the first and second LSB banks so that the state of the first LSB bank is complementary with the state of the second LSB bank.

19. The method of claim 16 wherein the decoder sets a state of the MSB bank based upon the MSB values from the digital input signal.

20. The method of claim 16 wherein the output network comprises first and second pluralities of switches coupled respectively to outputs of the first and second sub-DACs.

21. The method of claim 16 wherein each LSB bank comprises:
a plurality of LSB switches coupled in parallel to one of the first and second reference voltages; and
a plurality of LSB resistors, each LSB resistor being coupled between adjacent ones of the plurality of LSB switches.

22. The method of claim 21 wherein the MSB bank comprises:
a plurality of MSB switches coupled in parallel to an output of each sub-DAC; and a plurality of MSB resistors, each MSB resistor being coupled between adjacent ones of the plurality of MSB switches.

\* \* \* \* \*

UNITED STATES PATENT AND TRADEMARK OFFICE
CERTIFICATE OF CORRECTION

PATENT NO. : 9,614,542 B2
APPLICATION NO. : 14/573083
DATED : April 4, 2017
INVENTOR(S) : James L. Worley et al.

Page 1 of 1

It is certified that error appears in the above-identified patent and that said Letters Patent is hereby corrected as shown below:

In Column 7, Line 26, Claim 10, delete "(LSE)" and insert --(LSB)--.

In Column 7, Line 28, Claim 10, delete "LSE" and insert --LSB--.

In Column 7, Line 43, Claim 10, delete "MSE" and insert --MSB--.

Signed and Sealed this
Tenth Day of July, 2018

Andrei Iancu
*Director of the United States Patent and Trademark Office*